United States Patent [19]
Prichard et al.

[11] Patent Number: 5,939,151
[45] Date of Patent: Aug. 17, 1999

[54] METHOD AND APPARATUS FOR REACTIVE PLASMA ATOMIZATION

[75] Inventors: Paul D. Prichard, Woodbury, Minn.; Matthew F. Besser, Urbandale; Daniel J. Sordelet, Ames, both of Iowa

[73] Assignee: Iowa State University Research Foundation, Inc., Ames, Iowa

[21] Appl. No.: 08/956,548

[22] Filed: Oct. 23, 1997

Related U.S. Application Data

[60] Provisional application No. 60/029,254, Oct. 25, 1996.
[51] Int. Cl.$^6$ .................................................. H05H 1/24
[52] U.S. Cl. ................. 427/576; 118/50; 118/723 VE; 118/726; 427/216; 427/250; 427/255.2; 427/295; 427/318
[58] Field of Search .................................... 427/576, 216, 427/250, 255.2, 295, 318; 118/723 VE, 726, 50

[56] References Cited

U.S. PATENT DOCUMENTS

| | | |
|---|---|---|
| 4,266,977 | 5/1981 | Steiger . |
| 4,612,045 | 9/1986 | Shintaku . |
| 4,731,517 | 3/1988 | Cheney . |
| 4,767,607 | 8/1988 | Schleich . |
| 4,801,435 | 1/1989 | Tylko . |
| 4,818,837 | 4/1989 | Pfender . |
| 5,124,091 | 6/1992 | Paliwal et al. . |
| 5,219,804 | 6/1993 | Weimer et al. . |
| 5,395,606 | 3/1995 | Xiao et al. . |

OTHER PUBLICATIONS

G. Selvaduray & L. Sheet, "Aluminum Nitride: Review of Synthesis Methods", *Materials Science and Technology*, Jun. 1993, vol. 9, pp. 463–473.

K.M. McHugh & J.F. Key, "Use of de Laval Nozzles in Spray Forming", *Journal of Thermal Spray Technology*, Jun. 1994, vol.3(2), pp. 191–196.

Peter C. Kong & Emil Pfender, "Plasma Processes", *Carbide, Nitride and Boride Materials Synthesis and Processing*. Published 1997, ISBN 0 412 54060 6. pp. 359–387. (No month available).

*Primary Examiner*—Bernard Pianalto
*Attorney, Agent, or Firm*—Zarley, McKee, Thomte, Voorhees & Sease

[57] ABSTRACT

A method and apparatus for producing AlN powder employing a vacuum chamber with a nozzle thereon having a hollow center crucible of graphite with a small feed hole in the bottom thereof. A device is provided for heating and melting aluminum in the crucible. A plasma gun connected to a source of argon and nitrogen is ignited below said feed hole, and melted aluminum moves into the plume of said plasma gun. The melted aluminum is atomized in the plume, and the droplets of aluminum are vaporized and react to the nitrogen in the plume, to create AlN which is collected in a collecting chamber.

25 Claims, 1 Drawing Sheet

METHOD AND APPARATUS FOR REACTIVE PLASMA ATOMIZATION

This application is based upon the applicants' provisional application Ser. No. 60/029,254 filed Oct. 25, 1996.

BACKGROUND OF THE INVENTION

There are many methods to produce AlN powder. Commercial production of AlN uses either the carbothermal reduction of $Al_2O_3$ or the nitridation of aluminum powder by a fluidized bed. The direct nitridation of aluminum powder occurs between 1300° C. and 1600° C. with a residence time of 2–3 seconds. The primary interest in AlN is the unusual property combination of high terminal conductivity (200 W/m-K) with a high electrical resistivity (>$10^{14}$ Ω-cm). The AlN material has distinct advantages for thermal management applications in multilayer chips. Other potential applications are for high conductivity refractory materials for investment casting shell systems, composite particulate reinforcement or advanced spark plug materials.

There are many methods to produce AlN powder. One disadvantage of commercial production of AlN is that the process involves complicated multiple steps, which sometimes produces hazardous by-products.

It is therefore a principal object of this invention to product AlN powder through a direct conversion process from pure metal to a reaction product.

A further object of this invention is to produce AlN powder with a simple apparatus with the incorporation of a melt system on top of a typical commercial plasma gun.

A further object of this invention is to produce AlN powder wherein no hazardous by-products will be created.

A still further object of this invention is to create AlN powder by feeding molten metal or alloys into a D.C. arc plasma torch to atomize the metal into droplets, and to simultaneously react the liquid droplets with the ionized plasma to produce a fine reacted AlN powder.

These and other objects will be apparent to those skilled in the art.

SUMMARY OF THE INVENTION

The apparatus of this invention consists of a commercially available D.C. plasma arc gun used for thermal spray coating. A schematic of the apparatus is shown in FIG. 1. A graphite nozzle with a convergent exit is bolted to the plasma gun using molybdenum bolts. A thermally insulative layer of zirconia felt is placed between the graphite nozzle and the copper face plate of the plasma gun to protect the gun and to permit the maximum thermal input from the plasma plume to the nozzle. A graphite crucible with a small feed hole (0.015 to 0.020 inches) is inserted perpendicularly into the graphite nozzle. The entire apparatus is enclosed in a vacuum chamber (<$10^{-2}$ torr) in order to prevent oxidation and promote nitridation of the molten aluminum droplets. A resistively heated kanthal furnace surrounds the graphite crucible such that the aluminum melt stock is melted (660° C.) and heated to the desired temperature (800° C. to 1200° C.). The temperature of the furnace and the molten bath are monitored with type K thermocouples. When the melt temperature reaches the desired level, the chamber is backfilled to the desired operating pressure (10 torr to 720 torr). The plasma gun is ignited, and the desired gas flow and argon/nitrogen ratio is adjusted 3 to 1. After a few minutes, the thermal energy from the plasma heats the graphite nozzle sufficiently to allow the aluminum to drain through the 0.015" hole in the bottom of the crucible. The superheated molten aluminum is gravity fed into the graphite nozzle and atomized into fine droplets by the plasma plume. The atomized droplets are accelerated by the plasma, while reacting with the nitrogen ions in the plasma plume. The chemical analysis and x-ray difraction of best powder produced a 75% conversion to aluminum nitride. Scanning electron microscopy reveal agglomerates ranging from 10 μm to 100 μm with the individual particles ranging from 10 nm to 100 nm.

DESCRIPTION OF THE PREFERRED EMBODIMENT

Figure 1:
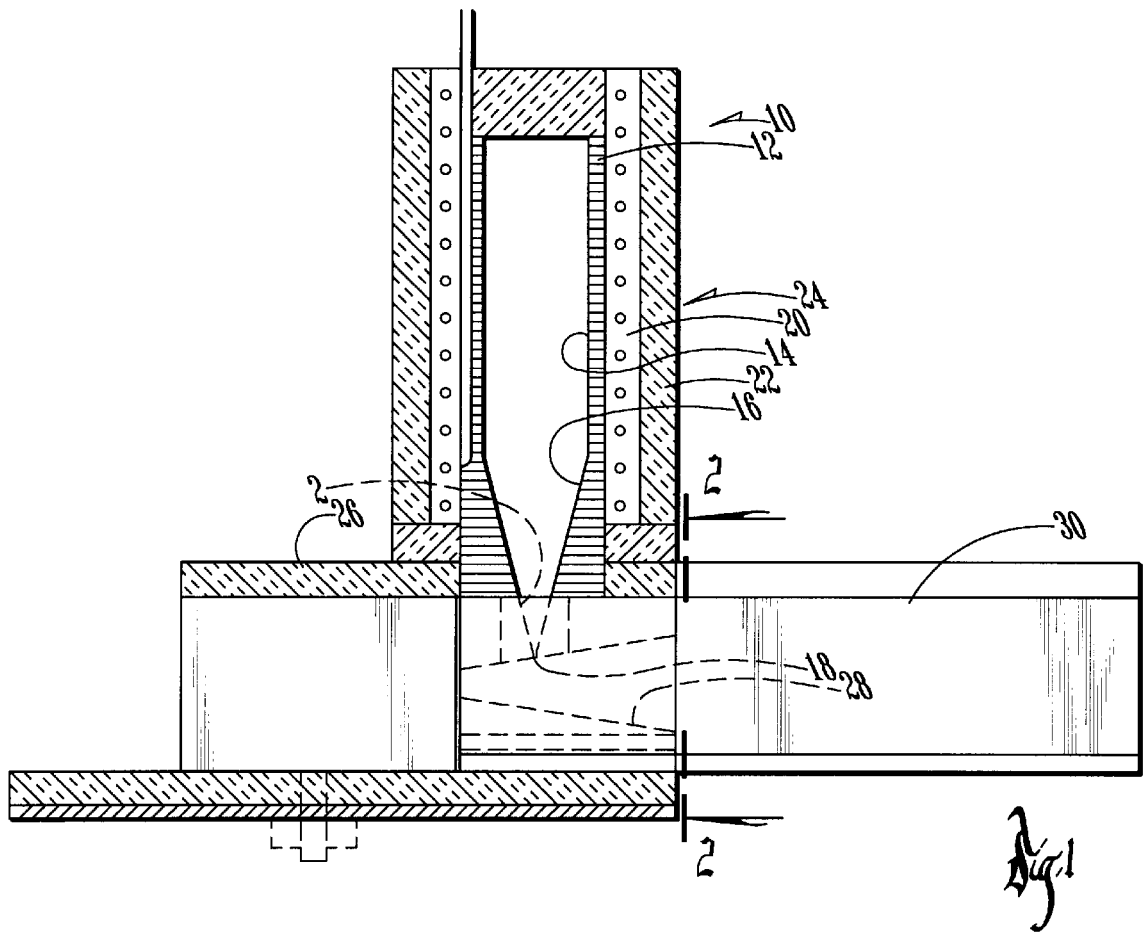
FIG. 1 is a schematic view of the apparatus of this invention.
Figure 2:
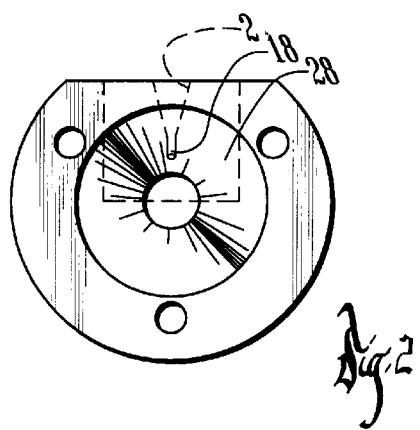
FIG. 2 is a cross sectional view taken on line 2—2 of FIG. 1.

FIGS. 1 and 2 show the apparatus of the invention to produce AlN powder.

With reference to FIG. 1, a vertical nozzle 10 has a vertical central bore 12 in which a vertically disposed graphite crucible 14 is mounted. The crucible 14 has an interior which has a conical shape 16 at its lower end which terminates in a small hole 18. A furnace wall 20 (kanthal furnace) surrounds the sides of crucible 14. A fibrous refractory insertion 22 surrounds nozzle 10 which is located within vacuum chamber 24.

A plasma arc gun 26 is located below nozzle 10 and a graphite nozzle 28 thereon is located below the hole 18 in crucible 14. The nozzle 28 is connected to a source of argon/nitrogen gas in a preferred ratio of 3/1, respectively. The nozzle 28 is in communication with a collection chamber 30.

More specifically, the apparatus of this invention consists of a commercially available D.C. plasma arc gun used for thermal spray coating. A schematic of the apparatus is shown in FIG. 1. A graphite nozzle with a convergent exit is bolted to the plasma gun using molybdenum bolts. A thermally insulative layer of zirconia felt is placed between the graphite nozzle and the copper face plate of the plasma gun to protect the gun and to permit the maximum thermal input from the plasma plume to the nozzle. A graphite crucible with a small feed hole (0.015 to 0.020 inches) is inserted perpendicularly into the graphite nozzle. The entire apparatus is enclosed in a vacuum chamber (<$10^{-2}$ torr) in order to prevent oxidation and promote nitridation of the molten aluminum droplets. A resistively heated kanthal furnace surrounds the graphite crucible such that the aluminum melt stock is melted (660° C.) and heated to the desired temperature (800° C. to 1200° C.). The temperature of the furnace and the molten bath are monitored with type K thermocouples. When the melt temperature reaches the desired level, the chamber is backfilled to the desired operating pressure (10 torr to 720 torr). The plasma gun is ignited, and the desired gas flow and argon/nitrogen ratio is adjusted 3 to 1. After a few minutes, the thermal energy from the plasma heats the graphite nozzle sufficiently to allow the aluminum to drain through the 0.015" hole in the bottom of the crucible. The superheated molten aluminum is gravity fed into the graphite nozzle and atomized into fine droplets by the plasma plume. The atomized droplets are accelerated by the plasma, while reacting with the nitrogen ions in the plasma plume. The chemical analysis and x-ray difraction of best powder produced a 75% conversion to aluminum nitride. Scanning electron microscopy reveal agglomerates ranging from 10 μm to 100 μm with the individual particles ranging from 10 nm to 100 nm.

In an experimental mode, a melt crucible and extension nozzle are designed for attachment to the face of the Miller Thermal SG-100 plasma gun, shown in FIG. 1. The graphite nozzle with an 18° divergent angle is attached to the plasma gun to control the expansion of the plasma. A graphite crucible with a small feed hole is attached to feed molten metal at 90° into the graphite nozzle at the point of divergence 25 mm from the face of the plasma gun, shown in FIG. 1. The liquid feeding for reactive plasma atomization depends primarily of the hydrostatic head pressure instead of a suction pressure as described for the horizontal atomizer and INEL DeLaval atomizer. The entire apparatus is enclosed in a vacuum chamber ($<10^{-2}$ torr) in order to prevent oxidation and promote nitridation of the molten aluminum droplets. The graphite crucible is charged with 60 to 80 grams of 99.99% aluminum rod. A resistively heated kanthal furnace surrounds the graphite crucible such that the aluminum melt stock is melted (660° C.) and superheated to 1000° C. The temperature of the furnace and the molten bath are monitored with type-K thermocouples. When the melt temperature reaches the desired level, the chamber is backfilled to the desired operating pressure (200 torr or 720 torr).

The operating parameters for the SG-100 gun are an argon flow of 40 l/min, a nitrogen flow of 25 l/min, a gun voltage of 60 volts and a gun amperage is 600 amps. A few minutes after the plasma gun is started, the thermal energy from the plasma heats the graphite nozzle sufficiently to allow the aluminum to drain through the feed hole in the bottom of the crucible. The superheated molten aluminum is gravity fed into the graphite nozzle and atomized into fine droplets by the plasma plume. The atomized droplets are accelerated and are heated to a liquid/vapor by the plasma, while reacting with the nitrogen in the plasma plume. This experimental mode well establishes the essential features of the present invention.

The advantages and features of this invention include the following:

1. This process has an advantage compared to commercial processes in that it is a direct conversion process from pure metal to reaction product. The current commercial methods rely on multiple steps.

2. The device is relatively simple with the incorporation of a melt system on top a typical commercial plasma gun.

3. The plasma reaction does not produce any hazardous by-products found in other processes such as ammonia, hydrogen, hydrogen chloride or other halogen containing species.

4. A wide variety of products can be produced dependent on the process parameters. A low metal feed rate (20 g/min) and subsonic plasma produces highly reacted product, whereas a high metal feed rate (200 g/min) with a supersonic plasma can produce a spray formed deposit with a low reaction.

5. The process can be scaled up with larger plasma torches (1 MW) and melt system (10 ton) to feed it on a semi-continuous basis.

6. Although the nozzle and crucible were fabricated from graphite, the materials could be produced from any refractory material, such as alumina, magnesia, or zirconia, compatible with the alloy system such as iron, copper, nickel, cobalt, magnesium, etc.

7. Alloy additions to the matrix which are more thermodynamically stable may be selectively reacted to form a composite powder insitu. For example, an aluminum alloy with 1 to 5% titanium could be reactive plasma atomized with nitrogen to produce an aluminum+TiN composite.

8. A metal matrix composite may be produced by using the existing powder feed mechanism with the liquid feed nozzle/crucible. A spray deposited strip, ring or tube may be produced from feeding a molten liquid into the nozzle extension, while feeding a refractory powder reinforcement, such as SiC, into the plasma gun for deposition. The spray formed structure should have a uniform distribution of the reinforcement throughout the matrix.

9. New exotic and interesting materials may be produced by feeding molten alloys into the plasma torch. For example, silicon forms $Si_3N_4$ or Sialon and they are an emerging high technology ceramic. Sialon is a generic class of ceramic materials comprised of silicon, aluminum, oxygen and nitrogen. If an alloy of Al—Si were plasma reactive atomized, a new hybrid material (Al,Si)N would be produced with better oxidation and perhaps better mechanical properties.

10. Any organization with a vacuum plasma chamber facility could easily experiment using this basic method and apparatus to develop new materials and applications for existing and emerging markets.

It is therefore seen that this invention will achieve at least all of its stated objectives.

What is claimed is:

1. A device for producing AlN powder, comprising
   a nozzle in a vacuum chamber having an internal vertical bore,
   a crucible in said bore having a vertically disposed interior with a lower end terminating in a small feed hole,
   a furnace wall surrounding said crucible,
   means for heating said crucible,
   an insulation material around said nozzle,
   a plasma gun being in communication with said feed hole to receive melted aluminum stock therethrough,
   said plasma gun being in communication with a mixture of argon and nitrogen to atomize said molten aluminum stock to create atomized droplets by a plasma plume created by igniting said mixture of argon and nitrogen whereupon the molten aluminum will react with nitrogen ions in the plasma plume to create AlN powder.

2. The device of claim 1 wherein said means for heating can heat said crucible to a temperature of 800° C. to 1200° C.

3. The device of claim 1 wherein the lower end of said interior of said crucible is conically shaped above said feed hole.

4. The device of claim 1 wherein said feed hole has a diameter of 0.015–0.020 inches.

5. The device of claim 1 wherein said vacuum compartment has a vacuum in the magnitude of approximately $<10^{-2}$ torr.

6. A method for producing AlN powder, comprising,
   placing a quantity of aluminum in a vertically disposed nozzle having a small feed opening in a lower end thereof,
   melting said aluminum,
   allowing said melted aluminum to move into an ignited gaseous plume comprised of a mixture of argon and nitrogen to create droplets of melted aluminum, whereupon said droplets will react with said plasma to create a quantity of AlN powder.

7. The method of claim 6 wherein said droplets are atomized and are accelerated and are heated to a liquid/vapor by said plume, while reacting to the nitrogen in said plume.

8. The method of claim 6 wherein said nozzle is placed in a vacuum compartment.

9. The method of claim 6 wherein said aluminum is heated to 800° C.–1200° after being melted.

10. The method of claim 9 wherein said gaseous plume is ignited underneath said feed hole to induce molten aluminum to move through said feed hole into said plume.

11. The method of claim 6 wherein said ratio of argon to nitrogen is approximately 3 to 1.

12. The method of claim 6 wherein said gaseous plume is generated by a plasma gun connected to a source of argon and nitrogen.

13. The method of claim 12 wherein plasma gun projects said plume through a convergent nozzle in a direction at right angles to said feed hole at a point 25 mm from the face of the plasma gun.

14. The method of claim 12 wherein said plasma gun has an argon flow of 40 l/min, a nitrogen flow of 25 l/min, a gun voltage of 60 volts and a gun amperage of 600 amps.

15. A device for producing a composite powder of aluminum matrix and nitride, carbide, boride or oxide particulate reinforcement insitu, comprising a nozzle having an internal vertical bore, a crucible in said bore having a vertically disposed interior with a lower end terminating in a small feed hole, a furnace wall surrounding said crucible, means for heating said crucible, a plasma gun being in communication with said feed hole to receive melted metal stock therethrough, said plasma gun being in communication with a mixture of reactive plasma containing nitrogen, hydrocarbon, boron gaseous species or oxygen to atomize said molten metal alloy to create atomized droplets by a plasma plume whereupon the molten metal will react with nitrogen ions in the plasma plume to create a composite powder.

16. The device of claim 15 wherein said crucible and nozzle are located within a chamber with a controlled pressure from 10 torr to 2000 torr.

17. A method for producing a composite powder of aluminum matrix and nitride, carbide, boride or oxide particulate reinforcement insitu, comprising, placing a quantity of metal alloy in a vertically disposed nozzle having a small feed opening in a lower end thereof, melting said metal, allowing said melted metal to move into a reactive plasma., said plasma being in communication with a mixture of reactive plasma containing nitrogen, hydrocarbon, boron gaseous species or oxygen to atomize said molten metal alloy to create droplets of melted metal to create a quantity of composite powder.

18. The method of claim 17 where the molten alloy is aluminum-silicon with additional nitride, carbide or boride alloy elements, such as niobium, titanium, hafnium, zirconium or rare earth metal, and the ractive plasma contains nitrogen, hydrocarbon, boron gaseous species and oxygen to produce an insitu ceramic matrix composite droplet with Sialon matrix with boride, nitride or carbide reinforcement, which is deposited on a part to produce a protective coating, or on a substrate to produce a sheet, plate or tubular shape of the Sialon composition.

19. The method of claim 17 wherein said crucible and nozzle are located within a chamber with a controlled pressure from 10 torr to 2000 torr.

20. The method of claim 17 wherein said metal is one from the group of alloy additions such as niobium, titanium, hafnium, zirconium or rare earth metal which is added to form a thermodynamically favorable nitride, carbide, boride or oxide composite.

21. The method of claim 17 wherein an atomized and reacted droplet is deposited on a substrate to produce an insitu composite sheet, plate or tubular shape.

22. The method of claim 17 wherein a particulate reinforcement is introduced into the plasma by the feed opening and deposited with the plasma atomized and reacted droplets to produce a composite sheet, plate or tubular shape.

23. The method of claim 17 wherein the molten alloy is aluminum-silicon, and the reactive plasma contains nitrogen and oxygen to produce a Sialon powder.

24. The method of claim 17 wherein the molten alloy is aluminum-silicon, and the reactive plasma contains nitrogen and oxygen to produce a Sialon droplet, which is deposited on a part to produce a protective coating, or on a substrate to produce a sheet, plate or tubular shape of the Sialon composition.

25. The method of claim 17 wherein the molten alloy is aluminum-silicon with additional nitride, carbide or boride alloy elements, such as niobiium, titanium, hafnium, zirconium or rate earth metal, and the reactive plasma contains nitrogen, hydrocarbon, boron gaseous species and oxygen to produce an insitu ceramic matrix composite powder of Sialon matrix with boride, nitride or carbide reinforcement.

* * * * *